United States Patent
He et al.

(10) Patent No.: US 12,449,331 B2
(45) Date of Patent: Oct. 21, 2025

(54) DETECTING FAILURE OF A FAN OF AN INFORMATION HANDLING SYSTEM

(71) Applicant: Dell Products L.P., Round Rock, TX (US)

(72) Inventors: Qinghong He, Austin, TX (US); Douglas Jarrett Peeler, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 343 days.

(21) Appl. No.: 17/811,147

(22) Filed: Jul. 7, 2022

(65) Prior Publication Data

US 2024/0011874 A1    Jan. 11, 2024

(51) Int. Cl.
*G01M 99/00* (2011.01)
*H04R 1/08* (2006.01)
*H04R 3/00* (2006.01)
*H05K 7/20* (2006.01)

(52) U.S. Cl.
CPC ............ *G01M 99/008* (2013.01); *H04R 1/08* (2013.01); *H04R 3/00* (2013.01); *H05K 7/20136* (2013.01); *H04R 2430/01* (2013.01)

(58) Field of Classification Search
None
See application file for complete search history.

(56) References Cited

U.S. PATENT DOCUMENTS

| | | | |
|---|---|---|---|
| 2009/0092261 A1* | 4/2009 | Bard | G06F 1/3203 381/71.1 |
| 2021/0092517 A1* | 3/2021 | Kulkarni | H04R 1/326 |
| 2022/0147128 A1* | 5/2022 | Stevens | F04D 27/004 |

* cited by examiner

*Primary Examiner* — Raymond L Nimox
(74) *Attorney, Agent, or Firm* — McDermott Will & Schulte LLP

(57) ABSTRACT

Detecting failure of a fan of an IHS, including comparing a sound pressure level of an environment noise associated with an environment of the IHS with a threshold; determining, based on the comparing, that the sound pressure level of the environment noise is less than the threshold, and in response: increasing a magnitude of RPM of the fan to correspond to a sound pressure level of a fan noise greater than the sound pressure level of the environmental noise; analyzing a frequency spectrum of the fan noise; determining, based on the analyzing, whether the frequency spectrum of the fan noise includes discrete tones at one or more harmonic frequencies of the fan at the RPM; determining that the frequency spectrum of the fan noise includes discrete tones at one or more harmonic frequencies of the fan at the RPM, and perform an action that is in response to such determination.

20 Claims, 7 Drawing Sheets

DETECTING FAILURE OF A FAN OF AN INFORMATION HANDLING SYSTEM

BACKGROUND

Field of the Disclosure

The disclosure relates generally to an information handling system, and in particular, detecting failure of a fan of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In information handling systems, a fan can be the only moving part. However, the fan can experience failure, leading to catastrophic of the information handling system.

SUMMARY

Innovative aspects of the subject matter described in this specification may be embodied in a method of detecting failure of a fan of an information handling system, the method including identifying a sound pressure level of an environmental noise associated with an environment of the information handling system; comparing the sound pressure level of the environment noise with a threshold; determining, based on the comparing, that the sound pressure level of the environment noise is less than the threshold, and in response: increasing a magnitude of a revolutions per minute (RPM) of the fan to correspond to a sound pressure level of a fan noise greater than the sound pressure level of the environmental noise; analyzing a frequency spectrum of the fan noise; determining, based on the analyzing, whether the frequency spectrum of the fan noise includes discrete tones at one or more harmonic frequencies of the fan at the RPM; and determining that the frequency spectrum of the fan noise includes discrete tones at one or more harmonic frequencies of the fan at the RPM, and perform an action that is in response to such determination.

Other embodiments of these aspects include corresponding systems, apparatus, and computer programs, configured to perform the actions of the methods, encoded on computer storage devices.

These and other embodiments may each optionally include one or more of the following features. For instance, identifying the sound pressure level of the environmental noise further includes decreasing the magnitude of the RPM of the fan to zero. Identifying the sound pressure level of the environmental noise further includes maximizing a gain of a microphone of the information handling system. Calculating the RPM of the fan that corresponds to the sound pressure level of the fan noise greater than the sound pressure level of the environmental noise. After calculating, the method further comprising analyzing a frequency spectrum of the environmental noise; determining, based on the analyzing, whether the frequency spectrum of the environmental noise includes any discrete tones at the one or more harmonic frequencies at the RPM; and determining that the frequency spectrum of the environmental noise does not includes discrete tones at the one or more harmonic frequencies of the fan at the RPM, and in response, increasing the magnitude of the RPM of the fan that corresponds to the sound pressure level of the fan noise greater than the sound pressure level of the environmental noise. Determining that the frequency spectrum of the fan noise includes discrete tones at the one or more harmonic frequencies of the fan at the RPM, and in response: calculating a roughness of the fan noise; determining whether the roughness of the fan noise is greater than a threshold; and determining that the roughness of the fan noise is greater than the threshold, and in response, perform an action that is in response to such determination. Performing the action further includes increasing a fan trigger temperature setting. Performing the action further includes providing a notification.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
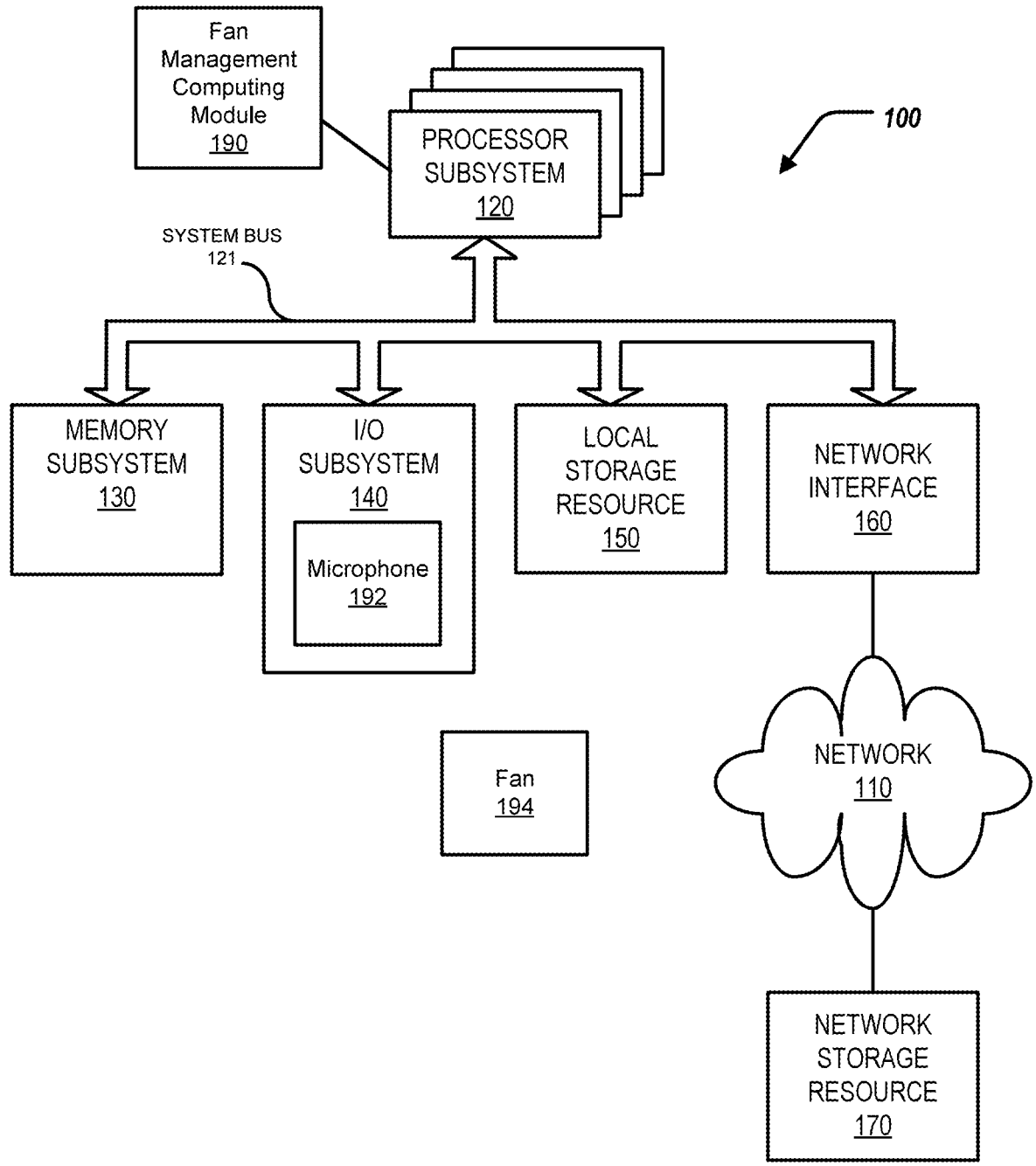
FIG. 1 is a block diagram of selected elements of an embodiment of an information handling system.

This disclosure discusses methods and systems for detecting failure of a fan of an information handling system. In short, a microphone can detect fan noise from a fan (acoustic noise footprint) that can indicate a failure of the fan. Once a failure of the fan has been detected, proper actions can be taken to minimize and/or mitigate impact of the fan failure.

Specifically, this disclosure discusses a system and a method for detecting failure of a fan of an information handling system, including identifying a sound pressure level of an environmental noise associated with an environment of the information handling system; comparing the sound pressure level of the environment noise with a threshold; determining, based on the comparing, that the sound pressure level of the environment noise is less than the threshold, and in response: increasing a magnitude of a revolutions per minute (RPM) of the fan to correspond to a sound pressure level of a fan noise greater than the sound pressure level of the environmental noise; analyzing a frequency spectrum of the fan noise; determining, based on the analyzing, whether the frequency spectrum of the fan noise includes discrete tones at one or more harmonic frequencies of the fan at the RPM; and determining that the frequency spectrum of the fan noise includes discrete tones at one or more harmonic frequencies of the fan at the RPM, and perform an action that is in response to such determination.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

The I/O subsystem 140 can further include a microphone 192.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can further include a fan 194.

The information handling system 100 can also include a fan management computing module 190. The fan management computing module 190 can be included by or associated with the processor subsystem 120.

In short, the microphone 192 can detect fan noise from the fan 194 (acoustic noise footprint) that can indicate a failure of the fan 194. Once a failure of the fan 194 has been detected, the fan management computing module 190 can take proper actions to minimize and/or mitigate impact of the fan failure.

Figure 2:
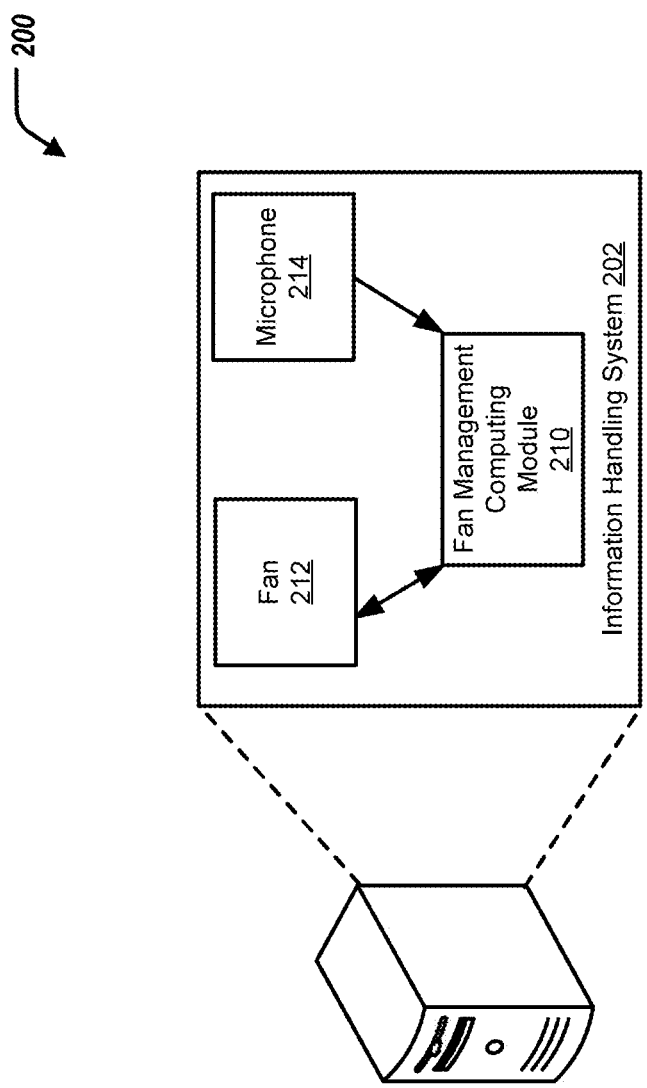
FIG. 2 illustrates a block diagram of an information handling system.

Turning to FIG. 2, FIG. 2 illustrates an environment 200 including an information handling system 202. The information handling system 202 can include a fan management computing module 210, a fan 212, and a microphone 214 (or microphone array 214). In some examples, the information handling system 202 is similar to, or includes, the information handling system 100 of FIG. 1. In some examples, the fan management computing module 210 is the same, or substantially the same, as the fan management computing module 190 of FIG. 1. In some examples, the fan 212 is the same, or substantially the same, as the fan 194 of FIG. 1. In some examples, the microphone 214 is the same, or substantially the same, as the microphone 192 of FIG. 1.

The fan management computing module 214 is in communication with the microphone 214 and the fan 212.

Figure 3:
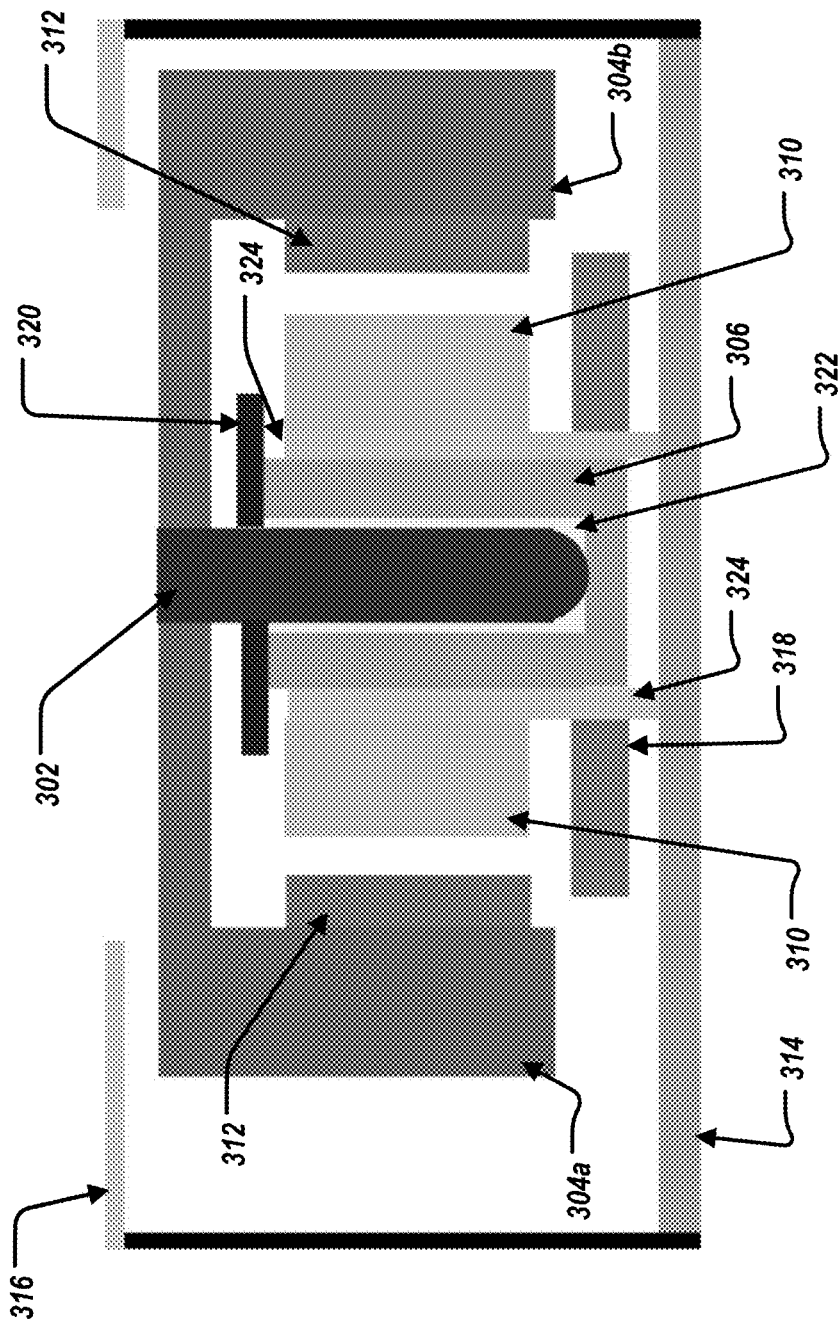
FIG. 3 is a cutaway side view of a fan of the information handling system.

FIG. 3 is a cutaway side view of the fan 212. The fan 212 can include a shaft 302, a first fan blade 304a, a second fan blade 304b (collectively referred to as fan blades 304), a sleeve 306, stators 310, magnets 312, a base 314, a fan cover 316, a printed circuit board (PCB) 318, and a sealing washer 320.

The sleeve 306 surrounds the shaft 302. The sleeve 306 can extend from the base 314.

The fan 212 can further include a lubricant 322 that surrounds the shaft 302 and positioned between the shaft 302 and the sleeve 306. Further, the sealing washer 320 can facilitate containing the lubricant 322 around the shaft 302

The stators 310 can be coupled to a support structure 324 that extend from the base 314. The stators 310 can substantially surround the sleeve 306.

The fan blades 304 can be connected to the shaft 302. The first fan blade 304a can extend away from the shaft 302 in a first direction; and the second fan blade 304b can extend away from the shaft 302 in a second direction opposite to the first direction. In some examples, the fan blades 304 can be considered a single fan blade 304. In some examples, the first fan blade 304a and the second fan blade 304b are connected, forming a congruent fan blade. The fan blades 304 can rotate about the shaft 302.

The magnets 312 can be coupled to respective fan blades 304 and positioned adjacent to the stators 310. The magnets 312 can substantially surround the stators 310 and the sleeve 306. The magnets 312 and the stators 310 facilitate rotation of the fan blades 304 with respect to the conductive shaft 302 (e.g., clockwise rotation and/or counter-clockwise rotation).

The PCB 318 can provide control/management of the fan 214, and in particular, rotation of the fan blades 304.

Figure 5B:
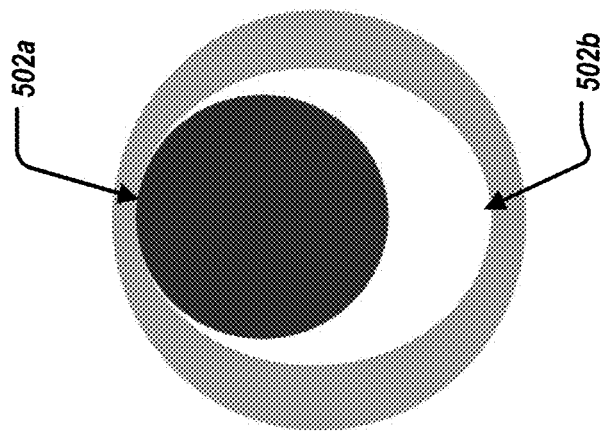
FIGS. 5A, 5B are top down views of a portion of the fan.
Figure 5A:
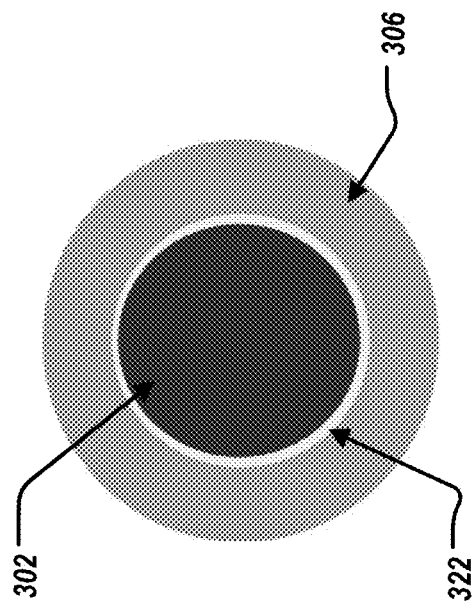

FIG. 5A illustrates a top down view of a portion of the fan 212. Particularly, the shaft 302 and the sleeve 306 are shown, with the lubricant 322 positioned therebetween. The lubricant 322 can facilitate rotation of the shaft 302, and ultimately, the fan blades 304. The shaft 302 can be circular (from the top down perspective), with the shaft 302 having a corresponding circular shape (from the top down perspective).

Figure 4:
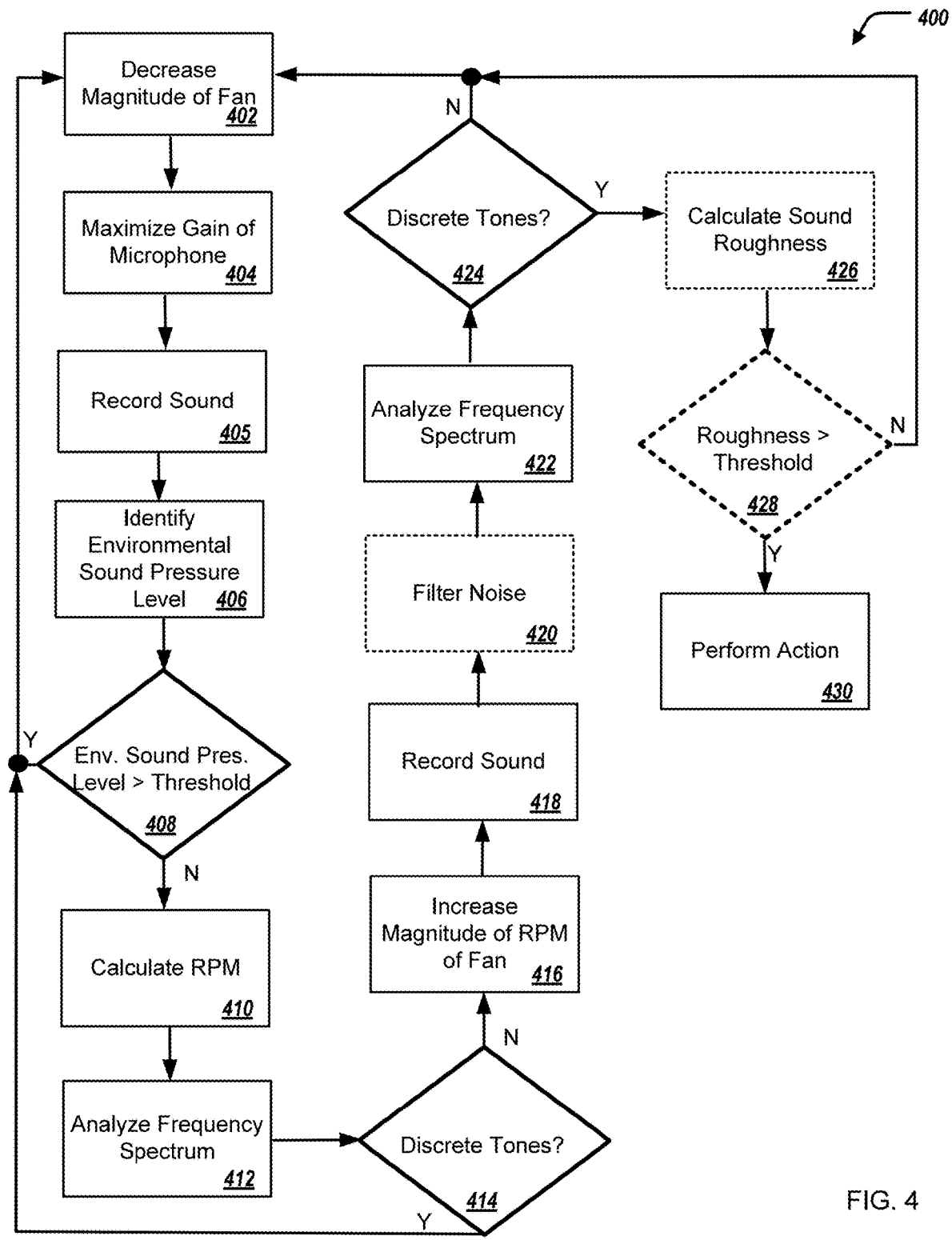
FIG. 4 illustrates a method for detecting failure of the fan of the information handling system.

FIG. 4 illustrates a flowchart depicting selected elements of an embodiment of a method 400 for detecting failure of the fan 212 of the information handling system 202. The method 400 may be performed by the information handling system 100, the information handling system 202, and/or the fan management computing module 210, and with reference to FIGS. 1-3, 5, and 6. It is noted that certain operations described in method 400 may be optional or may be rearranged in different embodiments.

The fan management computing module 210 can decrease the magnitude of the revolutions per minute (RPM) of the fan 212 to zero, at 402. That is, the fan management computing module 210 can change the state of the fan 212 to an off-state.

The fan management computing module 210 can maximize a gain of the microphone 214, at 404. That is, the fan management computing module 210 can set gain of the microphone 214 to a maximum level without digital amplification, e.g., 0 decibels (dB) (to avoid digital distortion).

The microphone 214 records sounds of the environment of the information handling system 202, at 405. That is, the microphone 214 records ambient noise of the environment of the information handling system 202 (environmental sounds) for a duration (e.g., 5 seconds). The microphone 214 can record the environmental sounds with signal processing, e.g., noise cancelling, disabled.

The fan management computing module 210 can receive such sound recordings, and identify a sound pressure level of the environmental noise associated with the environment of the information handling system 202, at 406. That is, the fan management computing module 210 calculates a relative sound pressure level of the environmental noise, e.g., 38 dBA.

The fan management computing module 210 compares the sound pressure level of the environmental noise with a threshold, at 408. For example, the fan management computing module 210 determines whether the sound pressure level of the environmental noise is greater than a preset value, e.g., 38 dBA.

In some examples, the fan management computing module 210 can determine, based on the comparing, that the sound pressure level of the environmental noise is greater than the threshold (at 408). In response to determining that the sound pressure level of the environmental noise is greater than the threshold, the process returns to step 402.

In some examples, the fan management computing module 210 can determine, based on the comparing, that the sound pressure level of the environmental noise is less than the threshold (at 408). In response to determining that the sound pressure level of the environmental noise is less than the threshold, the fan management computing module 210 calculates the RPM of the fan 212 that corresponds to a sound pressure level of fan noise greater than the sound pressure level of the environmental noise, at 410. That is, the fan management computing module 210 calculates the RPM of the fan 212 that corresponds to a higher acoustic noise level as compared to the environmental noise. For example, for 4 dBA higher than the environmental noise of 38 dBA for a 42 dBA, a RPM of 3120 of the fan 212 corresponds to the 42 dBA.

The fan management computing module 210 analyzes the frequency spectrum of the environmental noise, at 412. That is, the fan management computing module 210 analyzes the frequency spectrum of the recorded ambient noise.

The fan management computing module 210 determines, based on the analyzing, whether the frequency spectrum of the environmental noise includes any discrete tones at one or more harmonic frequencies at the calculated RPM of the fan 212, at 414. For example, the fan management computing module 210 determines whether the frequency spectrum of the environmental noise includes any discrete tones at one or more harmonic frequencies, e.g., 52 Hz, 104 Hz, 156 Hz, etc., between 50 to 1000 Hz.

In some examples, the fan management computing module 210 determines that the frequency spectrum of the environmental noise includes discrete tones at one or more harmonic frequencies at the calculated RPM of the fan 212 (at 414), and in response, the process returns to step 402.

In some examples, the fan management computing module 210 determines that the frequency spectrum of the environmental noise does not include discrete tones at one or more harmonic frequencies at the calculated RPM of the fan 212 (at 414), and in response, increases the magnitude of the RPM of the fan 212 to the sound pressure level of the fan noise greater than the sound pressure level of the environmental noise, at 416. That is, the fan management computing module 210 increases the magnitude of the RPM of the fan 212 (from zero RPM) that corresponds to the sound pressure level of the fan noise (e.g., 42 dBA) greater than the sound pressure level of the environmental noise (e.g., 38 dBA)—the calculated RPM. For example, the fan management computing module 210 sets the RPM of the fan 212 to correspond to 4 dBA above the environmental noise, e.g., 3120 RPM (52 Hz).

The microphone 214 records sounds of the fan and the environment of the information handling system 202, at 418. That is, the microphone 214 records the fan noise (and, in some examples, also the ambient noise of the environment of the information handling system 202 (environmental sounds)) for a duration (e.g., 10 seconds). The microphone 214 can record the fan sounds (and, in some examples, the environmental sounds) with signal processing, e.g., noise cancelling, disabled.

The fan management computing module 210 can receive such sound recordings, and optionally, filter background noise from the recorded sound, at 420. That is, the fan management computing module 210 can filter/conceal/subtract the recorded background noise (e.g., environmental sounds) from the fan noise.

The fan management computing module 210 analyzes the frequency spectrum of the fan noise, at 422. That is, the fan management computing module 210 analyzes the frequency spectrum of the recorded ambient noise. For example, the fan management computing module 210 analyzes the frequency spectrum of the fan noise to determine whether the fan noise has characteristics of an "unhealthy" fan. For example, FIG. 5B illustrates a top down view of a portion of the fan 212 that is "unhealthy." That is, after an extended period of time of use of the fan 212 (e.g., after months or years), the fan 212 can experience loss of the lubricant 322 (e.g., due to manufacturing inconsistency and higher-temperature environments), as shown in FIG. 5B. Thus, as a result without the lubricant 322, after an extended period of time of rotations, the shaft 302 begins to "wear" on the sleeve 306, resulting in degradation of the sleeve 306, and in particular, at points 502*a* and 502*b* (collectively referred to as points 502) of the sleeve 306. Thus, the sleeve 306 becomes oval shaped (from the top down perspective), and when the shaft 302 rotates against the sleeve 306 (without lubricant 322), resonant frequencies are produced in the order of fan rotation speed (in Hz) (e.g., from metal to metal frictional contact between the shaft 302 and the sleeve 306). That is, every contact between the shaft 302 and the sleeve 306 (e.g., at points 502) produces discrete tones at harmonic frequencies.

Figure 6A:
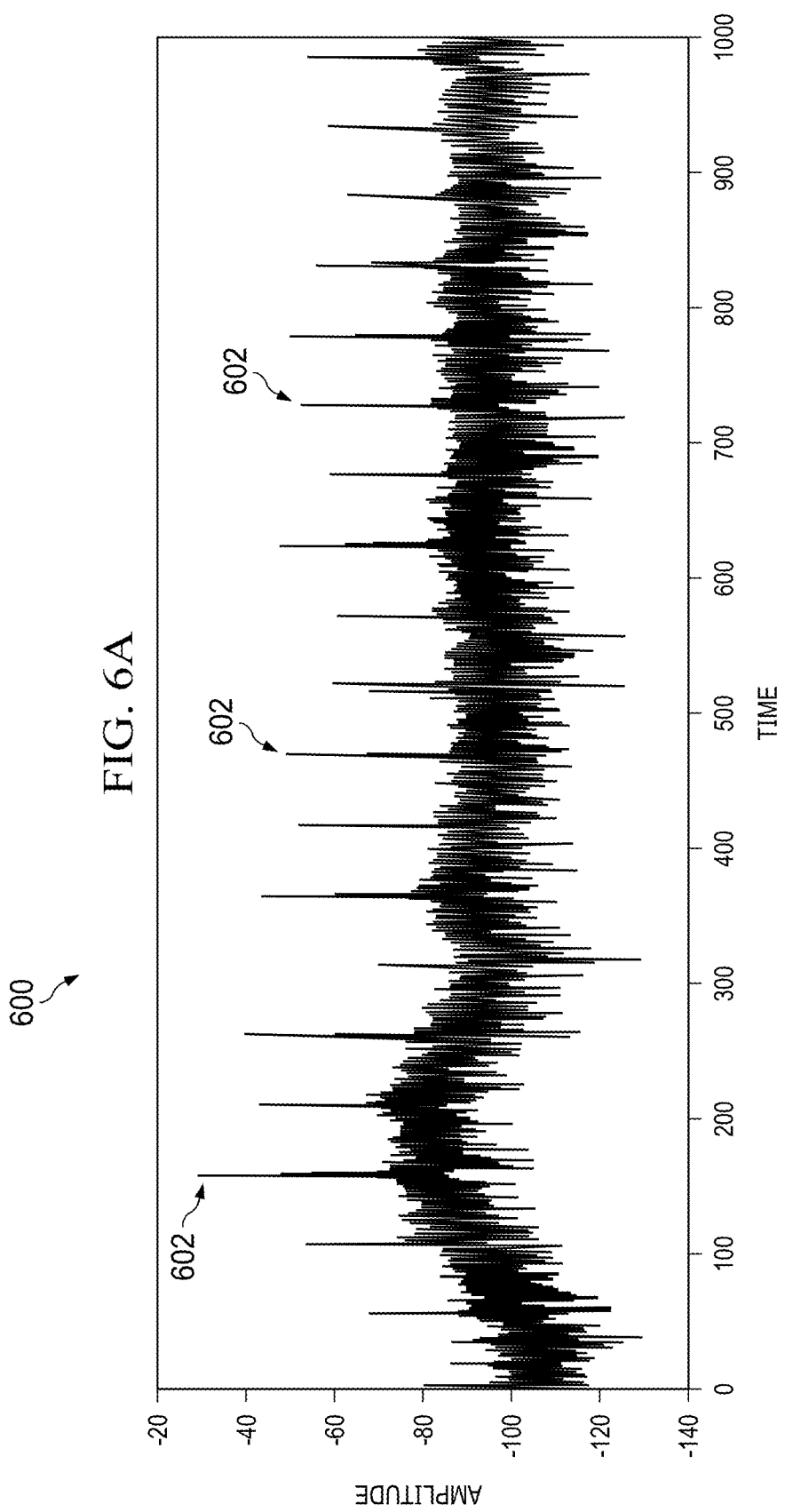
FIGS. 6A, 6B are graphs illustrating frequency spectrums associated with a fan noise of the fan.
Figure 6B:
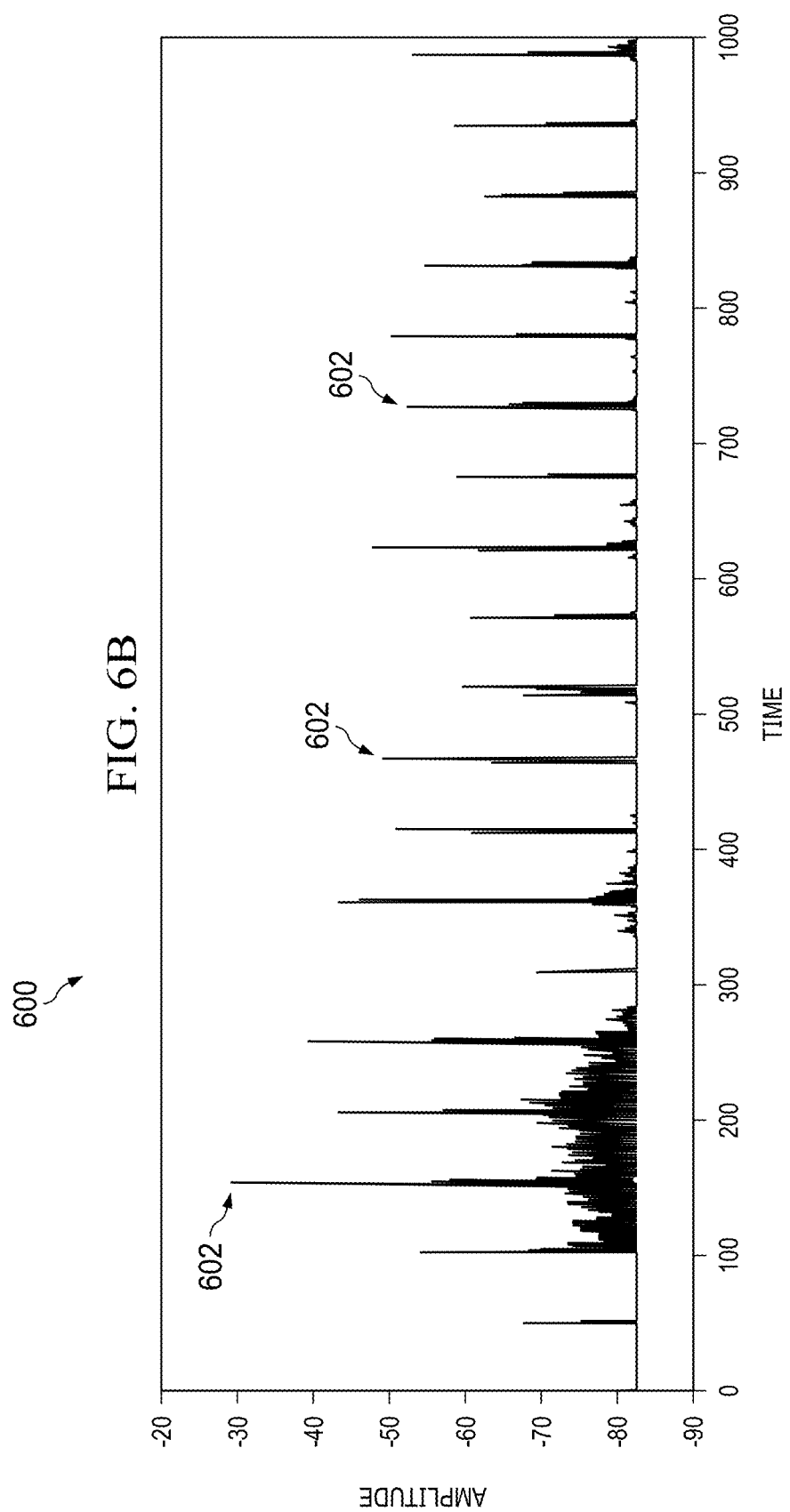

The fan management computing module 210 determines, based on the analyzing, whether the frequency spectrum of the fan noise includes any discrete tones at one or more harmonic frequencies at the RPM of the fan 212, at 424. For example, the fan management computing module 210 determines whether the frequency spectrum of the fan noise includes any discrete tones at one or more harmonic frequencies, e.g., 52 Hz, 104 Hz, 156 Hz, etc., between 50 to 1000 Hz. FIG. 6A illustrates a graph 600 of the (unfiltered) frequency spectrum of the fan noise. The graph 600 illustrates discrete tones 602 at a plurality of harmonic frequencies. FIG. 6B illustrates a graph 600' of the frequency spectrum after filtering (at step 420) of the fan noise including discrete tones 602 at the harmonic frequencies.

In some examples, the fan management computing module 210 determines that the frequency spectrum of the fan noise does not include any discrete tones at one or more harmonic frequencies at the RPM of the fan 212 (at 424), and returns to step 402.

In some examples, the fan management computing module 210 determines that the frequency spectrum of the fan noise does include discrete tones at one or more harmonic frequencies at the RPM of the fan 212 (at 424), and in response, optionally, calculates a roughness of the fan noise, at 426. In some examples, the roughness of the fan noise quantities sound temporal fluctuations of the fan noise between 30 to 500 Hz.

The fan management computing module 210 determines, optionally, whether the roughness of the fan noise is greater than a threshold, at 428. In some examples, when the roughness of the fan noise is less than the threshold, the process returns to step 402. For example, the threshold can be 0.3 asper. In some examples, when the roughness of the fan noise is greater than the threshold, the fan management computing modules 210 performs an action in response to such determination, at 430.

In some examples, when steps 426 and 428 are optionally not performed, when the fan management computing module 210 determines that the frequency spectrum of the fan noise does include discrete tones at one or more harmonic frequencies at the RPM of the fan 212 (at 424), the fan management computing modules 210 performs an action in response to such determination, at 430. In some examples, the fan management computing modules 210 performs the action at 430 including increasing a fan trigger temperature setting of the fan 212. For example, the fan management computing module 210 increases the fan trigger temperature setting from 51° C. at 3100 RPM to 65° C. at 3100 RPM. In short, by increasing the fan trigger temperature setting, the life of the fan 212 can be extended by reduced usage.

In some examples, the fan management computing modules 210 performs the action at 430 including providing a notification. For example, the notification can be presented on a display of the information handling system 202, or provided to another computing device associated with a user of the information handling device 202. The notification can include details regarding the life of the fan 212, and/or a warning to take further action by the user (e.g., backup data stored by the information handling system 202). In some examples, the notification can be provided to a service team of the information handling system 202 (e.g., an information technical team tasked with servicing the information handling system 202).

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computer-implemented method of detecting failure of a fan of an information handling system, the method comprising:
    identifying a sound pressure level of an environmental noise associated with an environment of the information handling system;
    comparing the sound pressure level of the environment noise with a threshold;
    determining, based on the comparing, that the sound pressure level of the environment noise is less than the threshold, and in response:
        increasing a magnitude of a revolutions per minute (RPM) of the fan to correspond to a sound pressure level of a fan noise greater than the sound pressure level of the environmental noise;
        analyzing a frequency spectrum of the fan noise;
        determining, based on the analyzing, whether the frequency spectrum of the fan noise includes discrete tones at one or more harmonic frequencies of the fan at the RPM;
        determining that the frequency spectrum of the fan noise includes discrete tones at one or more harmonic frequencies of the fan at the RPM; and
        in response to determining that the frequency spectrum of the fan noise includes discrete tones at one or more harmonic frequencies of the fan at the RPM, determining that a shaft of the fan is contacting a sleeve of the fan at one or more points to produce the discrete tones at the harmonic frequencies, and perform an action that is in response to such determination.

2. The computer-implemented method of claim 1, wherein identifying the sound pressure level of the environmental noise further includes decreasing the magnitude of the RPM of the fan to zero.

3. The computer-implemented method of claim 1, wherein identifying the sound pressure level of the environmental noise further includes maximizing a gain of a microphone of the information handling system.

4. The computer-implemented method of claim 1, further comprising calculating the RPM of the fan that corresponds to the sound pressure level of the fan noise greater than the sound pressure level of the environmental noise.

5. The computer-implemented method of claim 4, after calculating, the method further comprising:
   analyzing a frequency spectrum of the environmental noise;
   determining, based on the analyzing, whether the frequency spectrum of the environmental noise includes any discrete tones at the one or more harmonic frequencies at the RPM; and
   determining that the frequency spectrum of the environmental noise does not includes discrete tones at the one or more harmonic frequencies of the fan at the RPM, and in response, increasing the magnitude of the RPM of the fan that corresponds to the sound pressure level of the fan noise greater than the sound pressure level of the environmental noise.

6. The computer-implemented method of claim 4, further comprising:
   determining that the frequency spectrum of the fan noise includes discrete tones at the one or more harmonic frequencies of the fan at the RPM, and in response:
   calculating sound temporal fluctuations of the fan noise;
   determining whether the sound temporal fluctuations of the fan noise is greater than a threshold; and
   determining that the sound temporal fluctuations of the fan noise is greater than the threshold, and in response, perform an action that is in response to such determination.

7. The computer-implemented method of claim 1, wherein performing the action further includes increasing a fan trigger temperature setting.

8. The computer-implemented method of claim 1, wherein performing the action further includes providing a notification.

9. An information handling system, comprising:
   a fan;
   a microphone
   a processor;
   memory media storing instructions executable by the processor to perform operations:
   identifying a sound pressure level of an environmental noise associated with an environment of the information handling system;
   identifying, by the microphone a sound pressure level of an environmental noise associated with an environment of the information handling system;
   comparing the sound pressure level of the environment noise with a threshold;
   determining, based on the comparing, that the sound pressure level of the environment noise is less than the threshold, and in response:
   increasing a magnitude of a revolutions per minute (RPM) of the fan to correspond to a sound pressure level of a fan noise greater than the sound pressure level of the environmental noise;
   analyzing a frequency spectrum of the fan noise;
   determining, based on the analyzing, whether the frequency spectrum of the fan noise includes discrete tones at one or more harmonic frequencies of the fan at the RPM;
   determining that the frequency spectrum of the fan noise includes discrete tones at one or more harmonic frequencies of the fan at the RPM; and
   in response to determining that the frequency spectrum of the fan noise includes discrete tones at one or more harmonic frequencies of the fan at the RPM, determining that a shaft of the fan is contacting a sleeve of the fan at one or more points to produce the discrete tones at the harmonic frequencies, and perform an action that is in response to such determination.

10. The information handling system of claim 9, wherein identifying the sound pressure level of the environmental noise further includes decreasing the magnitude of the RPM of the fan to zero.

11. The information handling system of claim 9, wherein identifying the sound pressure level of the environmental noise further includes maximizing a gain of a microphone of the information handling system.

12. The information handling system of claim 9, the operations further comprising calculating the RPM of the fan that corresponds to the sound pressure level of the fan noise greater than the sound pressure level of the environmental noise.

13. The information handling system of claim 12, after calculating, the operations further comprising:
   analyzing a frequency spectrum of the environmental noise;
   determining, based on the analyzing, whether the frequency spectrum of the environmental noise includes any discrete tones at the one or more harmonic frequencies at the RPM; and
   determining that the frequency spectrum of the environmental noise does not includes discrete tones at the one or more harmonic frequencies of the fan at the RPM, and in response, increasing the magnitude of the RPM of the fan that corresponds to the sound pressure level of the fan noise greater than the sound pressure level of the environmental noise.

14. The information handling system of claim 12, the operations further comprising:
   determining that the frequency spectrum of the fan noise includes discrete tones at the one or more harmonic frequencies of the fan at the RPM, and in response:
   calculating sound temporal fluctuations of the fan noise;
   determining whether the sound temporal fluctuations of the fan noise is greater than a threshold; and
   determining that the sound temporal fluctuations of the fan noise is greater than the threshold, and in response, perform an action that is in response to such determination.

15. The information handling system of claim 9, wherein performing the action further includes increasing a fan trigger temperature setting.

16. The information handling system of claim 9, wherein performing the action further includes providing a notification.

17. A non-transitory computer-readable medium storing software comprising instructions executable by one or more computers which, upon such execution, cause the one or more computers to perform operations comprising:

identifying a sound pressure level of an environmental noise associated with an environment of the information handling system;

comparing the sound pressure level of the environment noise with a threshold;

determining, based on the comparing, that the sound pressure level of the environment noise is less than the threshold, and in response:

increasing a magnitude of a revolutions per minute (RPM) of the fan to correspond to a sound pressure level of a fan noise greater than the sound pressure level of the environmental noise;

analyzing a frequency spectrum of the fan noise;

determining, based on the analyzing, whether the frequency spectrum of the fan noise includes discrete tones at one or more harmonic frequencies of the fan at the RPM;

determining that the frequency spectrum of the fan noise includes discrete tones at one or more harmonic frequencies of the fan at the RPM; and in response to determining that the frequency spectrum of the fan noise includes discrete tones at one or more harmonic frequencies of the fan at the RPM, determining that a shaft of the fan is contacting a sleeve of the fan at one or more points to produce the discrete tones at the harmonic frequencies, and perform an action that is in response to such determination.

18. The computer-readable medium of claim 17, wherein identifying the sound pressure level of the environmental noise further includes decreasing the magnitude of the RPM of the fan to zero.

19. The computer-readable medium of claim 17, wherein identifying the sound pressure level of the environmental noise further includes maximizing a gain of a microphone of the information handling system.

20. The computer-readable medium of claim 17, the operations further comprising calculating the RPM of the fan that corresponds to the sound pressure level of the fan noise greater than the sound pressure level of the environmental noise.

* * * * *